United States Patent
Dong et al.

(10) Patent No.: US 9,762,221 B2
(45) Date of Patent: Sep. 12, 2017

(54) RC LATTICE DELAY

(71) Applicant: ANALOG DEVICES GLOBAL, Hamilton (BM)

(72) Inventors: Yunzhi Dong, Woburn, MA (US); Victor Kozlov, Toronto (CA); Wenhua W. Yang, North Andover, MA (US); Trevor Clifford Caldwell, Toronto (CA); Hajime Shibata, Toronto (CA)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 15/182,430

(22) Filed: Jun. 14, 2016

(65) Prior Publication Data
US 2016/0373101 A1    Dec. 22, 2016

Related U.S. Application Data

(60) Provisional application No. 62/180,527, filed on Jun. 16, 2015.

(51) Int. Cl.
*H03M 1/38* (2006.01)
*H03K 5/14* (2014.01)
(Continued)

(52) U.S. Cl.
CPC ............. *H03K 5/14* (2013.01); *H03H 7/30* (2013.01); *H03M 1/001* (2013.01); *H03M 3/464* (2013.01);
(Continued)

(58) Field of Classification Search
CPC ........... H03K 5/14; H03K 2005/00267; H03K 2005/00254; H03M 1/001; H03M 3/464; H03H 7/30
(Continued)

(56) References Cited

U.S. PATENT DOCUMENTS

| 701,552 A | 6/1924 | Zobel |
|---|---|---|
| 792,523 A | 3/1927 | Zobel |

(Continued)

FOREIGN PATENT DOCUMENTS

| CN | 102404014 | 4/2012 |
|---|---|---|
| CN | 102891682 | 1/2013 |

(Continued)

OTHER PUBLICATIONS

Notice of Allowance issued in KR Patent Application Serial No. 10-2015-0026711 mailed Aug. 9, 2016 and English Translation of Allowed Claims, 8 pages.
(Continued)

*Primary Examiner* — Brian Young
(74) *Attorney, Agent, or Firm* — Patent Capital Group

(57) ABSTRACT

An integrated constant time delay circuit utilized in continuous-time (CT) analog-to-digital converters (ADCs) can be implemented with an RC lattice structure to provide, e.g., a passive all-pass lattice filter. Additional poles created by decoupling capacitors can be used to provide a low-pass filtering effect in some embodiments. A Resistor-Capacitor "RC" lattice structure can be an alternative to a constant-resistance Inductor-Capacitor "LC" lattice implementation. ADC architectures benefit from the RC implementation, due to its ease of impedance scaling and smaller area.

20 Claims, 10 Drawing Sheets

(51) Int. Cl.
H03M 1/00 (2006.01)
H03M 3/00 (2006.01)
H03H 7/30 (2006.01)
H03K 5/00 (2006.01)

(52) U.S. Cl.
CPC .............. H03K 2005/00254 (2013.01); H03K 2005/00267 (2013.01)

(58) Field of Classification Search
USPC ...................................... 341/155, 161, 162
See application file for complete search history.

(56) References Cited

U.S. PATENT DOCUMENTS

| | | | |
|---|---|---|---|
| 4,344,093 A | 8/1982 | Huber | |
| 5,861,828 A | 1/1999 | Opris | |
| 6,064,507 A | 5/2000 | Heflinger et al. | |
| 6,222,477 B1 | 4/2001 | Irie et al. | |
| 6,489,913 B1 | 12/2002 | Hansen et al. | |
| 6,809,672 B2 | 10/2004 | Gupta | |
| 6,956,517 B1 | 10/2005 | Baker | |
| 7,280,064 B2 | 10/2007 | Lin | |
| 7,443,332 B2 | 10/2008 | Knudsen et al. | |
| 7,561,084 B1 | 7/2009 | Wong | |
| 8,102,206 B2 | 1/2012 | Shibata | |
| 8,284,085 B2 | 10/2012 | Haroun et al. | |
| 8,570,200 B2 | 10/2013 | Ashburn et al. | |
| 8,896,475 B2* | 11/2014 | Shibata ................. | H03M 1/001 341/155 |
| 9,124,293 B2* | 9/2015 | Belot .................... | H03M 3/484 |
| 9,312,840 B2 | 4/2016 | Dong et al. | |
| 9,509,331 B1* | 11/2016 | Pagnanelli ............ | H03M 3/358 |
| 9,537,497 B2* | 1/2017 | Ho ........................ | H03M 1/06 |
| 2002/0140516 A1 | 10/2002 | Dufour et al. | |
| 2005/0057384 A1 | 3/2005 | Chen et al. | |
| 2007/0013571 A1 | 1/2007 | Fujimoto | |
| 2008/0204148 A1 | 8/2008 | Kim et al. | |
| 2008/0238754 A1 | 10/2008 | Knudsen | |
| 2008/0272944 A1 | 11/2008 | Zhou | |
| 2009/0055678 A1 | 2/2009 | Kummaraguntla | |
| 2012/0063519 A1 | 3/2012 | Oliaei | |
| 2012/0086589 A1 | 4/2012 | Haroun et al. | |
| 2012/0086590 A1 | 4/2012 | Sataradeh | |
| 2012/0326906 A1 | 12/2012 | Haroun et al. | |
| 2013/0021180 A1 | 1/2013 | Shabra et al. | |
| 2013/0127646 A1 | 5/2013 | Kumar et al. | |
| 2013/0214946 A1 | 8/2013 | Verbruggen | |
| 2014/0266821 A1 | 9/2014 | Shibata | |
| 2015/0042501 A1 | 2/2015 | Shibata | |
| 2015/0109158 A1 | 4/2015 | Dong | |
| 2015/0249445 A1 | 9/2015 | Dong et al. | |
| 2016/0359498 A1 | 12/2016 | Shibata | |

FOREIGN PATENT DOCUMENTS

| | | |
|---|---|---|
| EP | 2779464 | 9/2014 |
| KR | 10-2012-0054087 | 5/2012 |
| KR | 10-1647252 | 8/2016 |
| WO | 2004/066494 | 8/2004 |
| WO | 2011/029103 | 3/2011 |

OTHER PUBLICATIONS

Examination Report issued in EP Patent Application Serial No. 1516825.0 mailed Dec. 2, 2016, 10 pages.
F.E. Terman, *Network Theory, Filters and Equalizers*, Proceedings of the IRE, vol. 31, Issue 6, pp. 288-302, Jun. 1943.
J. Choma, *Coupled Inductor, Constant Resistance, Broadband Delay Filter*, Analog Integr. Circuits Signal Process, vol. 54, No. 1, pp. 7-20, 2007.
S.K. Garakoui et al., *Frequency Limitations of First-Order gm-RC All-Pass Delay Circuits*, IEEE Transactions on Circuits and Systems, vol. 60, No. 9, pp. 572-576, Sep. 2013.
D. Gubbins et al., *Continuous-Time Input Pipeline ADCs*, IEEE JCCC, vol. 45, No. 8, pp. 1456-1468, Aug. 2010.
D.Y. Yoon et al., *An 85dB-DR 75.6dB-SNDR 60 MHz-BW CT MASH ΔΣ Modulator in 28nm CMOS*, ISSCC, 2015.
1st Non-Final Office Action issued in U.S. Appl. No. 14/194,107 mailed May 14, 2015, 11 pages.
Final Office Action issued in U.S. Appl. No. 14/194,107 mailed Oct. 8, 2015, 11 pages.
Notice of Allowance issued in U.S. Appl. No. 14/194,107 mailed Jan. 11, 2016, 11 pages.
Non-Final Office Action issued in U.S. Appl. No. 13/869,454 mailed Apr. 2, 2014.
Notice of Allowance issued in U.S. Appl. No. 13/968,454 mailed Jul. 14, 2014.
Non-Final Office Action issued in U.S. Appl. No. 14/524,729 mailed Apr. 6, 2015.
Notice of Allowance issued in U.S. Appl. No. 14/524,729 mailed Aug. 25, 2015.
Non-Final Office Action issued in U.S. Appl. No. 14/524,729 mailed Jan. 15, 2016, 11 pages.
2nd Notice of Allowance issued in U.S. Appl. No. 14/524,729 mailed May 4, 2016, 7 pages.
OA1 issued in Korean Patent Application Serial No. 10-2015-0026711 mailed Jan. 4, 2016, 6 pages.
English Summary of OA1 issued in Korean Patent Application Serial No. 10-2015-0026711 mailed Jan. 4, 2016, 6 pages.
Response to KR OA1 filed Mar. 4, 2016, 19 pages.
English Translations of Amended Claims in Response to KR OA1 filed Mar. 4, 2016, 6 pages.
Partial European Search Report issued in EP Patent Application Serial No. 1516825.0 mailed Jul. 8, 2015, 8 pages.
Extended European Search Report issued in EP Patent Application Serial No. 1516825.0 mailed Feb. 3, 2016, 19 pages.
W. Kester, Data Conversion Handbook 3rd edition, Chapter 3, Section 3.2, Analog Devices, Inc. ISBN—10:0750678410, 2004, 142 pages.
David Gubbins, Bumha Lee, Pavan Kumar Hanumolu, and Un-Ku Moon, "Continuous-Time Input Pipeline ADCs", IEEE J. Solid State Circuits, vol. 45, No. 8, Aug. 2010, pp. 1456-1468.
Ahmed Gharbiya, and David A. Johns, "A 12-bit 3.125 MHz Bandwidth 0-3 MASH Delta-Sigma Modulator", IEEE J. Solid-State Circuits, vol. 44, No. 7, Jul. 2009, pp. 2010-2018.
Masoud Koochakzadeh et al., "Miniaturized Transmission Lines Based on Hybrid Lattice-Ladder Topology", IEEE Transactions on Microwave Theory and Techniques, vol. 58, No. 4, Apr. 2010, pp. 949-946, 8 pages.
W. Kester, "Oversannpling interpolating DACs", MT-017, tutorial documents, Analog Devices, Inc. available at http://www.analog.com/static/imported-files/tutorials/MT-017.pdf, 2009.
B.Y. Karmath et al., "Relationship between frequency response and setting time of operational amplifiers", IEEE Journal of Solid-State Circuits, vol. SC-9, No. 6, Dec. 1974.
David Gubbins, Bumha Lee, Pavan Kumar Hanumolu, and Un-Ku Moon, "A Continuous-Time Input Pipeline ADC", Custom Integrated Circuit Conference, Sep. 2008.
David Gubbins, Bumha Lee, Pavan Kumar Hanumolu, and Un-Ku Moon, "A Continuous-Time Input Pipeline ADC with inherent anti-alias filter", Custom Integrated Circuit Conference, Sep. 2009.
Kwang-Jin Koh et al., *A Millimeter-Wave (40-45 GHz) 16-Element Phased-Array Transmitter in 0.18-μ Si Ge BiCMOS Technology*, IEEE Journal of Solid-State Circuits, vol. 44, No. 5, May 2009, 12 pages.
W.E. Thomson, *Delay Networks Having Maximally Flat Frequency Characteristics*, BNSDOCID: <XP55242803A, Paper No. 872, Radio Section, 621.392.5, (first received Mar. 14, 1949; revised Jul. 14, 1949), 4 pages.
Office Action (OA1) issued in CN Patent Application Serial No. 201410095239.1 mailed Sep. 26, 2016, (with Summary of Relevance) 8 pages.
Non-Final Office Action (OA1) issued in U.S. Appl. No. 15/240,278 mailed Jan. 19, 2017, 12 pages.

* cited by examiner

RC LATTICE DELAY

PRIORITY DATA

This is a non-provisional patent application receiving benefit of and claiming priority to provisional patent application Ser. No. 62/180,527, entitled "RC LATTICE DELAY". The provisional patent application is hereby incorporated by reference in its entirety.

TECHNICAL FIELD OF THE DISCLOSURE

The disclosure relates to the field of integrated circuits, in particular to resistor-capacitor (RC) lattice delay implemented in continuous time data converters.

BACKGROUND

In many electronics applications, an analog input signal is converted to a digital output signal (e.g., for further digital signal processing). For instance, in precision measurement systems, electronics are provided with one or more sensors to make measurements, and these sensors may generate an analog signal. The analog signal would then be provided to an analog-to-digital converter (ADC) as input to generate a digital output signal for further processing. In another instance, an antenna generates an analog signal based on the electromagnetic waves carrying information/signals in the air. The analog signal generated by the antenna is then provided as input to an ADC to generate a digital output signal for further processing.

ADCs can be found in many places such as broadband communication systems, audio systems, receiver systems, etc. ADCs can translate analog electrical signals representing real-world phenomenon e.g., light, sound, temperature or pressure for data processing purposes. Designing an ADC is a non-trivial task because each application may have different needs in performance, power, cost and size. ADCs are used in a broad range of applications including Communications, Energy, Healthcare, Instrumentation and Measurement, Motor and Power Control, Industrial Automation and Aerospace/Defense. As the applications needing ADCs grow, the need for accurate and reliable conversion performance also grows.

BRIEF DESCRIPTION OF THE DRAWINGS

To provide a more complete understanding of the disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
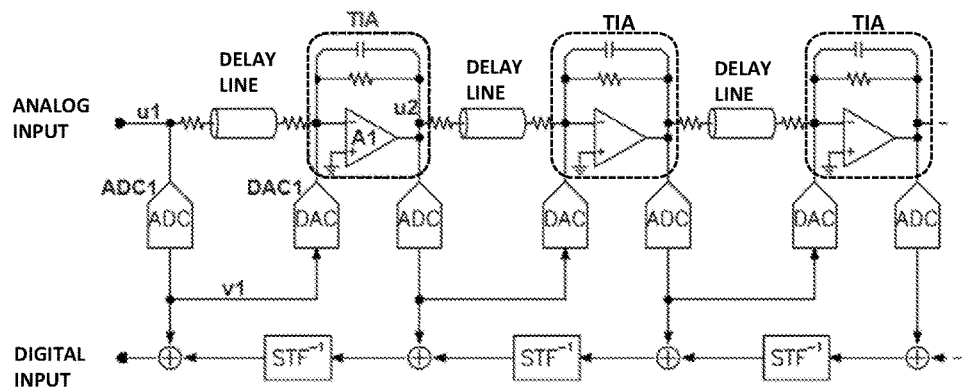
FIG. 1 is a simplified schematic diagram illustrating a system architecture of a continuous-time (CT) pipeline ADC comprising a plurality of delay lines, according to some embodiments of the disclosure.

An integrated constant time delay circuit utilized in continuous-time (CT) analog-to-digital converters (ADCs) can be implemented with an RC lattice structure to provide, e.g., a passive all-pass lattice filter. Additional poles created by decoupling capacitors can be used to provide a low-pass filtering effect in some embodiments. A Resistor-Capacitor "RC" lattice structure can be an alternative to a constant-resistance Inductor-Capacitor "LC" lattice implementation. ADC architectures benefit from the RC implementation, due to its ease of impedance scaling and smaller area.

Basics of Analog-to-Digital Converters

Analog to digital converters (ADCs) are devices that converts a continuous physical quantity to a digital number that represents the quantity's amplitude. The conversion involve quantization of the analog input signal, so conversion would generally introduce a small amount of error. Typically the quantization occurs through periodic sampling of the analog input signal. The result is a sequence of digital values (i.e., a digital signal) that has converted a continuous-time and continuous-amplitude analog input signal to a discrete-time and discrete-amplitude digital signal.

An ADC is usually defined by the following application requirements: its bandwidth (the range of frequencies of analog signals it can properly convert to a digital signal), its resolution (the number of discrete levels the maximum analog signal can be divided into and represented in the digital signal), and its signal to noise ratio (how accurately the ADC can measure signal relative to the noise the ADC introduces). Analog-to-digital converters (ADCs) have many different designs, which can be chosen based on the application requirements.

Many modern ADC designs, such as pipeline ADCs and multi-stage noise shaping ADCs or other kinds of multi-stage ADCs, comprises a plurality of stages for digitizing the signal and errors of the system in order to meet design requirements related to bandwidth, resolution, and the signal to noise ratios. One or more of these stages can use the original analog input signal (or another suitable analog signal in the converter) as a reference signal to produce a residual signal (i.e., an error between a filtered version or a reconstructed version of the analog input signal) in order to reduce the amount of noise introduced by the ADC and/or to increase the resolution of the output. The process for producing the residual can include matching the original analog input signal to the phase of the filtered version of the original analog input signal, since the filtering of the original analog input signal introduces a delay. Thus, a delay line is typically provided to delay the original analog input signal to match the phase of the filtered version in order to produce a desired residual signal. This process of generating a residue can also be applied to other analog signals in the ADC (e.g., quantization error or residue signal of a previous stage), and does not necessarily have to be the original input signal to the ADC.

Generally speaking, ADC architectures can be categorized according to the signal domains used during the conversion process (see Table 1). Discrete-time (DT) converters process signals in the discrete-time continuous-amplitude (DTCA) domain by using a sample-and-hold operator at the front end. Continuous-time (CT) architectures, such as the CT Delta-Sigma (CTDS) ADCs and CT pipeline ADCs omit this operation and process all continuous-amplitude signals in the continuous-time domain (CTCA).

TABLE 1

| Signal domains | | |
| --- | --- | --- |
| | Discrete-Time | Continuous-Time |
| Continuous Amplitude | DT Pipeline ADC<br>DT Delta-Sigma ADC<br>SAR ADC | CT Pipeline ADC<br>CT Delta-Sigma ADC |
| Discrete Amplitude | Digital Signals | — |

An improved delay line can be used in providing a delayed analog input signal, e.g., for producing the residual signal (other applications are also envisioned), using continuous-time (CT) circuitry. Specifically, the improved delay line has a Resistor-Capacitor (RC) lattice structure. To implement a delay line in a data converter, specifically, a continuous-time high speed data converter, is not trivial.

Example Application: Continuous Time Pipeline Analog-to-Digital Converters

One example circuit using delay lines to delay an analog input signal is a pipeline analog-to-digital converter (ADC). Traditionally, a pipeline ADC provide delay lines using switched-capacitor circuits. Switch-capacitor circuits provide a sample-and-hold-type of delay line for delaying the analog input signal in a residual producing stage of an ADC. For many embodiments described herein, the pipeline ADC having one or more delay lines do not use switched-capacitor circuits to provide the delay lines. Rather, continuous-time CT circuitry is used. The result is a (total) continuous-time (CT) pipeline analog-to-digital converter (ADC), which utilizes (all) CT circuitry to realize a pipeline ADC.

FIG. 1 is a simplified schematic diagram illustrating a system architecture of a continuous-time (CT) pipeline ADC comprising a plurality of delay lines, according to some embodiments of the disclosure. In particular, FIG. 1 illustrates the first three stages of a CT pipeline ADC. The analog input signal u1 gets digitized by a fast/coarse ADC (shown as ADC1, could be realized using a flash ADC), and the digital output of the fast/coarse ADC v1 is used to drive a current digital-to-analog converter (DAC) (shown as DAC1). The input voltage signal u1 is also converted into a signal current with some delay through the resistor and the delay line component (in some cases, the combination of the resistor and the delay line component can be considered as a delay line). The delay line component converts the input signal as a voltage into a delayed input signal as a current. The difference between the delayed signal (as a current) and the current-mode DAC output current is amplified by the transimpedance amplifier (shown as "TIA") which includes of an amplifier A1 and a shunt-shunt feedback network. The output of the amplifier, u2, becomes the analog input voltage signal into the second stage and so on. At the bottom of FIG. 1, the reconstruction of digital signal is illustrated. The digital outputs of each stage are generated by the ADCs and they are added together backwards with filtering response 1/STF (STF: the signal transfer function of each individual CT pipeline stage). The schematic circuit diagram in FIG. 1 is drawn single-ended but practical implementations are usually differential.

One reason for replacing switched-capacitor circuits in a discrete time (DT) delay line (used in traditional pipeline ADCs) with CT circuitry to provide a CT delay line is power consumption. The CT pipeline ADC having CT delay lines would generally have several times lower power consumption than the traditional pipeline ADCs while providing the same performance. For DT delay lines, the amplifier output current for charging the capacitors in switch-capacitor circuits is rather high in the beginning when the capacitors are charging, while the amplifier output current for the CT circuitry is generally constant and several times smaller han the maximum amplifier output current for switch-capacitor circuits (while keeping performance as a constant between the two). As a result, the power amplifiers in the pipeline ADC having DT delay lines need to be more power hungry (thus, consuming more power) than the power amplifier in the pipeline ADC having CT delay lines (while maintaining the same signal-to-noise ratio performance).

Importance of a Robust Delay Line

Delay lines, such as delay lines shown in FIG. 1, play a crucial role in architectures such as the CT pipeline ADCs and CT multi-stage noise shaping (MASH) ADCs. When implemented with real circuitry, the signal path having the ADC module and the DAC module (such as the ADC and DAC seen in FIG. 1 or other ADC architectures) will exhibit some inherent delay. In a typical integrated circuit (IC) implementation, the ADC and DAC is clocked by a clock signal CK. In some embodiments, this clock signal CK can determine the sampling rate of the overall CT pipeline ADC. The delay through the ADC and the DAC could be around or equivalent 1 to 2 (in most cases 1.5) CK periods. The delay would normally depend on the circuitry and application. If not compensated accordingly in the analog signal path through the delay line (between the input and the DAC output), there can be a phase difference between the analog input signal current and the current-mode DAC output current. This phase difference can cause a larger residue current signal that needs to be processed by the amplifier and the following CT pipeline stages. As a result, the amplifier needs to consume more power to deliver larger currents at certain distortion performance, and the inter-stage gain between pipeline stages needs to be reduced as well. The smaller inter-stage gain will reduce the thermal power efficiency of the pipeline ADC front-end and raise both power and complexity for a given resolution performance. This degradation will become worse as the input signal frequency increases. This issue is also present for CT MASH ADCs as well.

Figure 2:
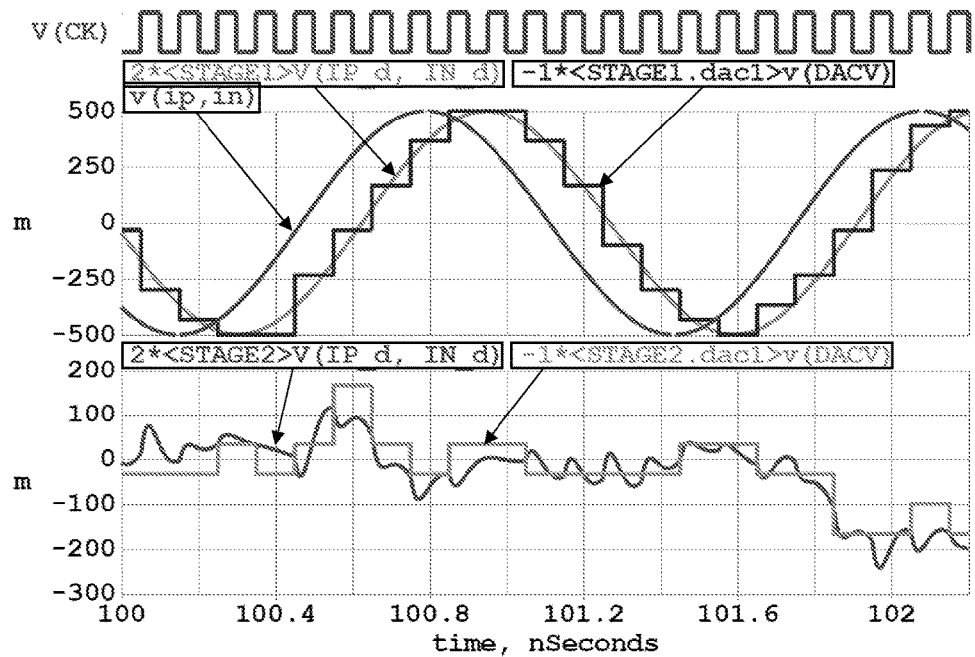
FIG. 2 is a plot of exemplary waveforms inside a continuous time (CT) pipeline analog-to-digital converter (ADC) such as the one shown in FIG. 1, according to some embodiments of the disclosure.

FIG. 2 is a plot of exemplary waveforms inside a continuous time (CT) pipeline analog-to-digital converter (ADC) such as the one shown in FIG. 1. In particular, FIG. 2 illustrates some typical simulated CT pipeline ADC waveforms. CK in the top subplot is the clock signal waveform. In the middle subplot, V(ip,in) is the analog input signal voltage. The delayed analog input voltage signal (labeled as 2*<STAGE1>V(IP_d,IN_d)) and the DAC output voltage (labeled as −1*<STAGE1.dac1>v(DACV), and referred herein generally as the filtered version of the analog input signal or a reconstructed version of the analog input signal) are plotted in the middle subplot in FIG. 2, respectively. The delayed analog signal and the DAC output signal (the filtered analog input signal) have been scaled to voltage signals from their corresponding current signals in order to better illustrate the importance of the delay. In the simulation, the ADC exhibits 1 clock cycle delay while the DAC exhibits an equivalent of 0.5 clock cycle delay. So it can be observed that the DAC output waveform is delayed by approximately 1.5 clock cycles with respect to the original analog input signal v(ip, in). With proper delay through the delay line, the delayed analog signal aligns to the DAC output signal and the residue signal can thus be minimized. At the bottom subplot of FIG. 2, the delayed analog input signal (labeled as 2*<STAGE2>V(IP_d,IN_d), which is also the output of the first stage, having a continuous and smooth appearance) and the DAC output signal (labeled as −1*<STAGE1.dac1>v(DACV), having a staircase appearance) of the second pipeline stage are plotted. With a proper delay line for aligning the delayed analog input signal with the filtered analog input signal, these two signals are aligned and the DAC output signal tracks the analog input signal as expected.

Lattice Phase Equalizer as a Delay Line

Figure 3:
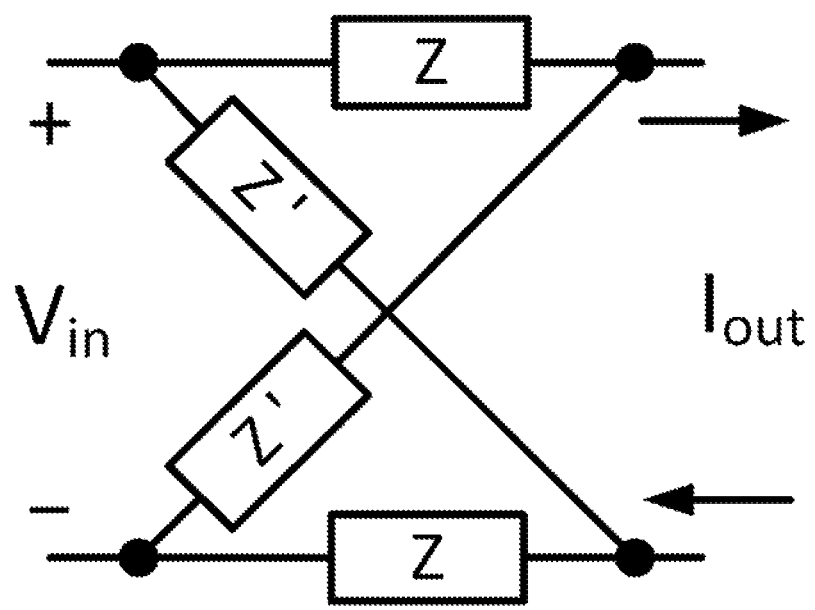
FIG. 3 shows a generalized lattice structure, according to some embodiments of the disclosure.

In some embodiments, a constant time delay can be implemented using an all-pass filter. The generalized lattice structure shown in FIG. 3 provides the greatest possible choice of characteristics that can be obtained in a filter. The Z components are cross coupled with respect to the Z' components. While a delay line can simply have a straight Z path from the input to the output, the cross coupled Z' components of the lattice structure shown enable different impedance over frequency. Accordingly, it is possible to implement phase shift from input voltage to output current over frequency. This phase shift can translate to a continuous time delay.

The impedance values Z and Z' can be selected to implement the desired transfer function. The transfer function of an ideal first-order all-pass filter with a left-hand pole and a right-hand zero both at frequency $\omega_p$ can be written as in (Eq. 1). The transfer function H(s) has a frequency-independent gain. The pole and zero locations define the frequency at which the phase shift is 90°. The group delay, D(w), defined in (Eq. 2), varies with frequency. The created group delay D(w) reduces to zero at high frequencies since the maximum phase shift from a first-order all-pass filter is limited to 180°. The group delay is approximately constant only for frequencies $\omega < \omega_p$. The constant group delay region can be extended by increasing the filter's order. All-pass filters implemented using the lattice structure are describe in a later section.

$$H(s) = \frac{1 - \frac{s}{\omega_p}}{1 + \frac{s}{\omega_p}} \quad \text{(Eq. 1)}$$

$$D(\omega) = \frac{-d\angle H(j\omega)}{d\omega} = \frac{2\omega_p}{\omega^2 + \omega_p^2} \quad \text{(Eq. 2)}$$

$$Z_0^2 = ZZ' \quad \text{(Eq. 3)}$$

Lattice filters are most commonly designed as constant resistance networks, conditioned to (Eq. 3). Such networks are characterized by a frequency-invariant input impedance $Z_0$ at the $V_{in}$ port in FIG. 3. However, a constant input impedance is not a required condition to implement H(s). One application for a non-constant resistance all-pass filter is described in a later section.

Example Application: A Residual Producing Stage or Circuit in a CT Pipeline Stage Constant time delay elements, with the lattice phase equalizer structure described above can be used in CT ADCs. Broadly speaking, the delay element can be used in a residual producing circuit, or in a CT pipeline (CTP) stage shown in FIG. 4. A residue producing circuit or pipeline stage produces the digital output by quantizing the input voltage waveform $V_{IN}(s)$ with a sub-ADC (e.g., a (coarse) analog-to-digital converter), clocked by a periodic signal CKF. The digital signal V is converted to a continuous time domain (CTCA) current $I_{DAC}(s)$, by the digital-to-analog converter DAC. $I_{DAC}(s)$ is then subtracted from the delayed input signal current $I_{DLY}(s)$. The quantization error $I_{RES}(s)$ (residue) is computed through the subtraction. The $I_{DLY}(s)$ current is linearly related to the input voltage by the transconductance G (Eq. 4) that is embedded in the CT delay element. The residue current signal, $I_{RES}(s)$, is then amplified and filtered before passing to the next stage.

$$I_{DLY}(s) = GH(s)V_{IN}(s) \quad \text{(Eq. 4)}$$

$$I_{RES}(s) = I_{DLY}(s) - I_{DAC}(s) \quad \text{(Eq. 5)}$$

Figure 5:
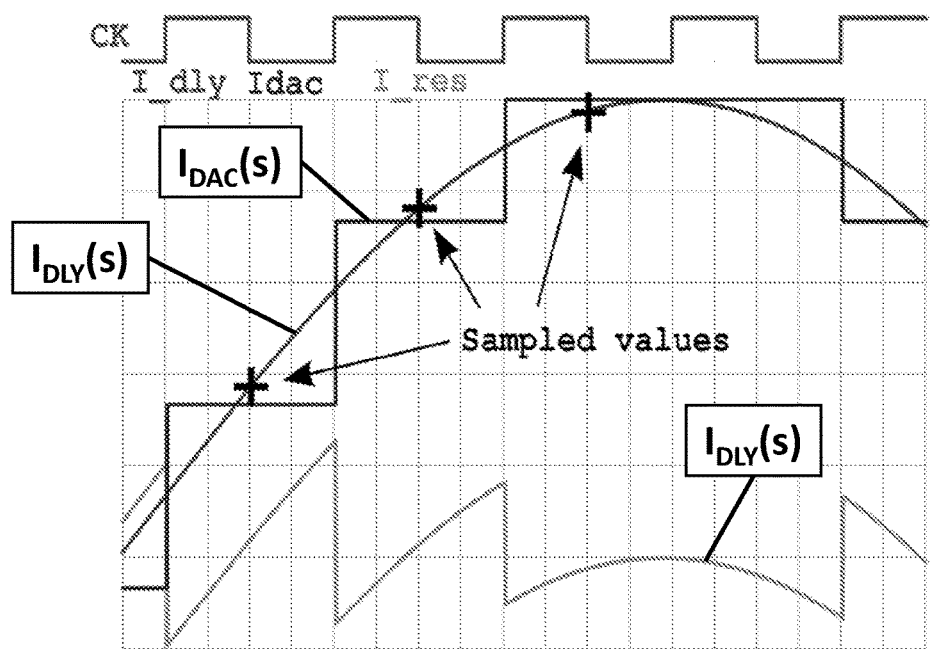
FIG. 5 shows current waveforms of a delayed analog input signal $I_{DLY}(s)$ and output of a digital-to-analog converter $I_{DAC}(s)$, according to some embodiments of the disclosure.

The magnitude of the residue signal current depends on the timing difference between the $I_{DAC}(s)$ and $I_{DLY}(s)$ currents. It can be shown that the residue current, $I_{RES}(s)$, is minimized when the sampled $V_{IN}(s)$ value coincides with the midpoint of the IDAC waveform, as illustrated in FIG. 5 (depicting CT pipeline current waveforms). This is equivalent to a constant half clock-cycle delay applied to $V_{IN}(s)$ by the H(s) all-pass filter transfer function (Eq. 4). However, a typical sub-ADC will add one clock cycle of latency, which can also be matched by the delay of H(s). The filter's order is lower bounded by the input signal bandwidth, which may not exceed the filter's range of frequencies with a constant group delay.

Note that a constant input impedance is not required if impedance matching is unnecessary, as is the case in the second and subsequent stages of a multi-stage ADC. An amplifier with sufficiently high current driving capabilities and bandwidth can correctly maintain the voltage $V_{IN}(s)$ regardless of the load impedance.

Example Application: A Residual Producing Stage or Circuit in a CT MASH ADC

Besides continuous-time pipeline ADCs described with FIGS. 1 and 2, a delay line is also used in other ADC architectures, such as ADC architectures which include a residual producing stage or circuit. For example, delta-sigma modulators/converters and multi-stage sigma-delta (MASH) ADCs includes such residual producing stage or circuit which would have a delay line.

Figure 6:
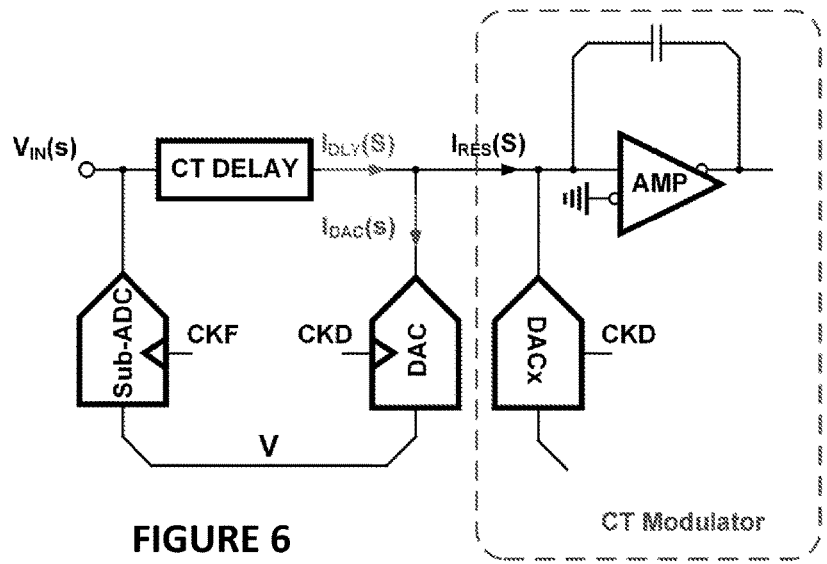
FIG. 6 shows an exemplary continuous-time 0-X style multi-stage noise shaping ADC, according to some embodiments of the disclosure.

FIG. 6 shows an exemplary CT 0-X style MASH ADC. A CT delay element is utilized in a 0-X MASH style ADC which is quite similar to the scenario of a CT pipeline ADC in FIG. 4. The difference is that the residue current, $I_{RES}(s)$, is fed to a continuous-time delta-sigma (CTDS) modulator instead of a residue amplifier.

Figure 7:
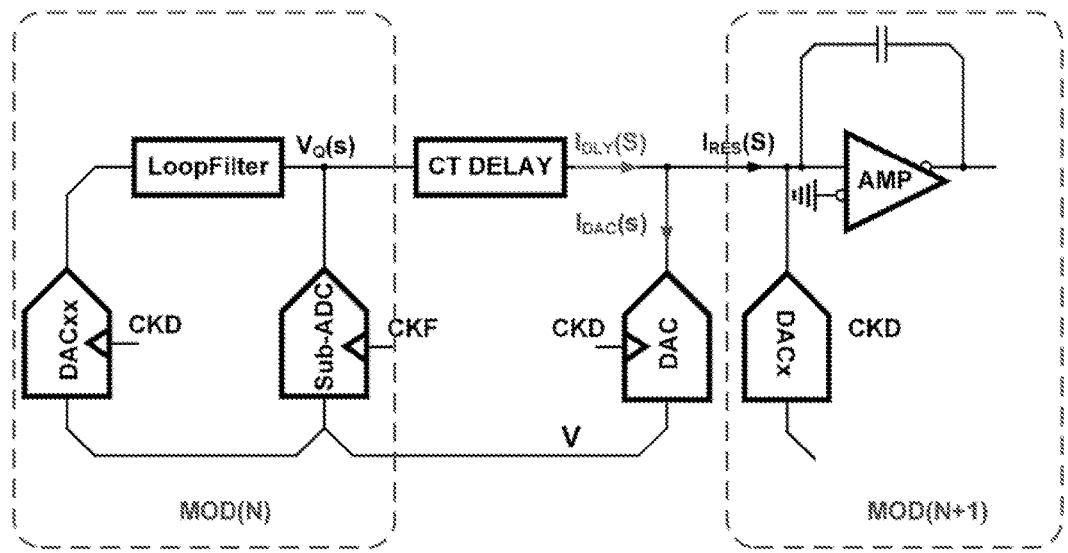
FIG. 7 shows exemplary continuous-time multi-stage noise shaping ADC, according to some embodiments of the disclosure.

FIG. 7 shows an exemplary CT MASH ADC. A CT delay element is used in regular CT MASH ADC. Comparing to the 0-X MASH ADC in FIG. 6, the difference is that the CT analog input voltage is the sub-ADC input that belongs to the previous CT modulator voltage MOD(N) (input voltage to the analog-to-digital converter of the previous stage). The CT delay provides group delay that matches the delay through the sub-ADC to DAC signal path and minimize the residue current amplitude that gets fed to the next CT modulator stage MOD(N+1).

Stage Impedance Scaling

Figure 8:
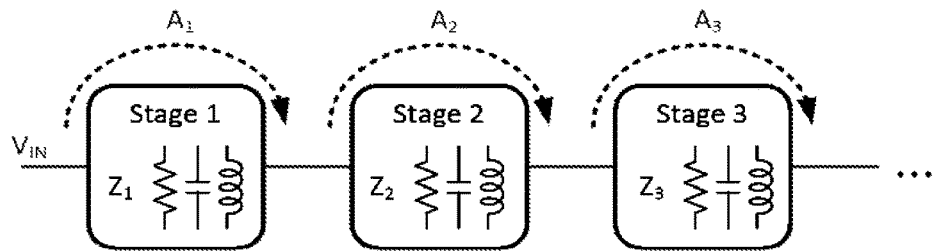
FIG. 8 shows an exemplary cascade of stages with an inter-stage gain A and impedance elements Z, according to some embodiments of the disclosure.

ADC architectures with gain stages can be made more efficient if some stages are impedance scaled. Impedance scaling can be applied to any stage by increasing all impedances by a constant factor without changing the stage's transfer function. Noise requirements in the n-th stage are relaxed by the total signal gain of the preceding stages $\Pi A_{n-1}$ (illustrated by FIG. 8, which shows a cascade of stages with an inter-stage gain A and impedance elements Z). The stage's impedance $Z_n$ can be increased by up to that amount in order to decrease the stage's power consumption. In order to reduce the cost of integrated circuits and to ease high-speed implementation, it is highly preferable if impedance scaling results in physically smaller circuit dimensions. On-chip inductors are a case of impedance scaling increasing the component's size, since inductance is proportional to the solenoid's area. Therefore, the use of monolithic inductors can be disadvantageous when compared to resistors and capacitors if impedance scaling is desirable.

Figure 4:
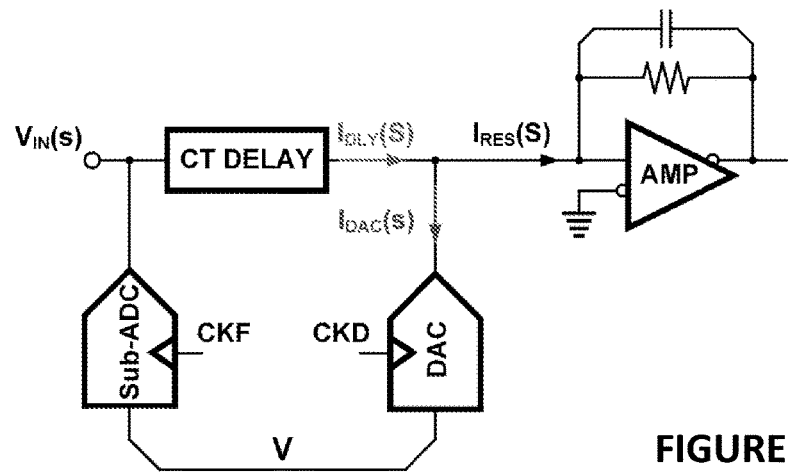
FIG. 4 shows an exemplary residue producing circuit or a continuous-time pipeline stage, according to some embodiments of the disclosure.

Impedance scaling can be applied to the CTP stage illustrated in FIG. 4. The CT delay block's transconductance, which is a function of the lattice Z and Z' impedance values (as previously described with FIG. 3), can be scaled proportionally with other circuit conductance. The capability for easy impedance scaling is also important for a CT delay element used inside a CT MASH ADC. The ability to have compact higher-impedance version CT delay allows the CT MASH ADC to be power scaled with respect to desired noise performance. For example, in a 0-X MASH ADC such as illustrated in FIG. 6, the impedance level of the CT delay element will set the baseline of thermal noise density level given certain input voltage fullscale.

Disadvantages of an LC Lattice Delay Line in Certain Scenarios

Figure 9:
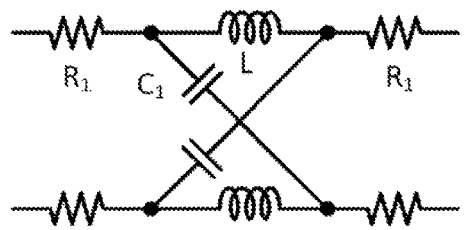
FIG. 9 shows a single LC lattice structure.
Figure 10:
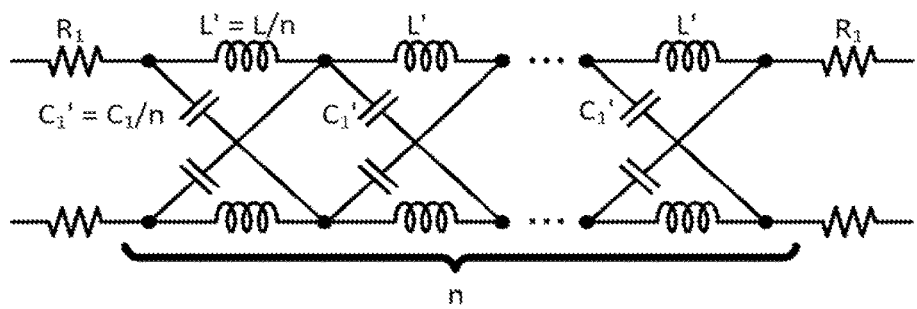
FIG. 10 shows cascaded LC lattice structures.

An LC lattice implementation of an all-pass filter are shown in FIGS. 9 (single LC lattice) and 10 (cascaded LC lattice). A single lattice achieves a 90° phase shift at $\omega_p=1/\sqrt{LC}$ and has a maximal phase shift of 180°. From Eq. 3, it can be seen that this is a constant resistance filter, with a characteristic impedance of $Z_0=2R_1=\sqrt{L/C}$. This property allows the LC structure to maintain an all-pass transfer function and constant resistance when cascaded, as shown in FIG. 9. With n cascaded lattice stages, the total maximal phase shift is increased to 180°×n, thereby extending the range of frequencies having the desired constant delay. For a given phase response and characteristic impedance, the sum total of all inductance and capacitance values remains unchanged regardless of n. The main disadvantage of the LC lattice in the CTP application is the need for integrated inductors. On-chip inductors require a relatively large area, have low Q-factor and are susceptible to Electromagnetic (EM) noise coupling. Additionally, inductor area scales proportionally to input impedance. This makes impedance scaling of CTP's back-end stages disadvantageous with LC-lattice based delay elements.

RC Lattice Delay Line

Figure 11:
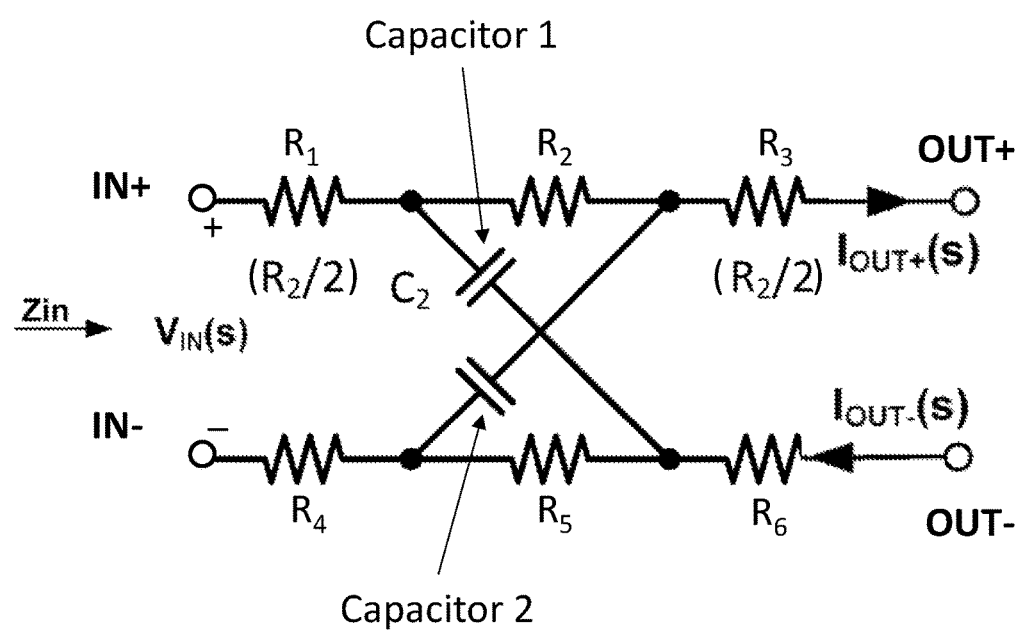
FIG. 11 shows an exemplary RC lattice first-order all-pass filter circuit, according to some embodiments of the disclosure.

A continuous-time delay line having an RC lattice first-order all-pass filter circuit is shown in FIG. 11. For this example, the differential transconductance magnitude is $4 \times R_2$ and is constant with frequency. The phase response is described by (Eq. 1). The selection of R and C values provides sufficient degrees of freedom to select any pole frequency ($\omega_p$) and transconductance value. The RC lattice structure can be used for providing a delay element as a part of a CT delay line, e.g., as seen in FIGS. 4, 6 and 7 (note these example applications are meant to be illustrative and non-limiting).

Referring to FIG. 11 IN+ and IN− stand for the analog input ports for receiving a differential analog input pair while OUT+ and OUT− stand for the output ports for outputting the delayed differential analog input pair. The RC lattice structure for generating a delayed differential analog input signal pair (OUT+ and OUT−) comprises of two resistive components $R_2$ and $R_5$ (two resistors) and two capacitive components Capacitor 1 and Capacitor 2 (two capacitors). Either (1) the two resistive components are cross coupled or (2) the two capacitive components are cross coupled. Phrased differently, the RC lattice for delaying a differential analog input pair IN+ and IN− has first and second resistive components (e.g., $R_2$ and $R_5$) and first and second capacitive components (e.g., Capacitor 1 and Capacitor 2) The first and second resistive components are cross coupled with respect to the first and second capacitive components.

The continuous-time delay line having the RC lattice can be used for (or in) a residual producing circuit. The delayed differential analog input pair and a filtered version of the differential analog input pair are used to generate a residual signal. The filtered version of the differential analog input pair can be a signal reconstructed from a digitized version of the differential analog input pair (as illustrated by FIGS. 4, 6, and 7). To ensure the delay matches the signal path generating the filtered version of the differential analog input pair, parameters of the RC lattice correspond to a phase component of a circuit path producing the filtered version of the differential analog input pair.

In some embodiments, the differential analog input pair is digitized by an analog-to-digital converter, whose output is provided to a digital-to-analog converter to produce the filtered version of the differential analog input pair. These embodiments are illustrated by FIGS. 4 and 6.

In some embodiments, the differential analog input pair is an analog output of a first delta-sigma modulator stage. This analog output can be the input to an analog-to-digital converter of the first delta-sigma modulator stage, or the output of the loop filter of the first delta-sigma modulator stage. The differential analog input pair is digitized by an analog-to-digital converter of the first delta-sigma modulator stage, whose output is provided to a digital-to-analog converter to produce the filtered version of the differential analog input pair. The residue signal is provided as input to a second delta-sigma modulator stage. These embodiments are illustrated by FIG. 7.

The delayed differential analog input pair and the filtered version of the differential analog input pair can be coupled to a summation node to generate the residual signal. In this example, the delayed differential analog input pair and the filtered version of the differential analog input pair are in the form of currents. A node joining the two currents can be used for producing the residual signal.

Figure 14:
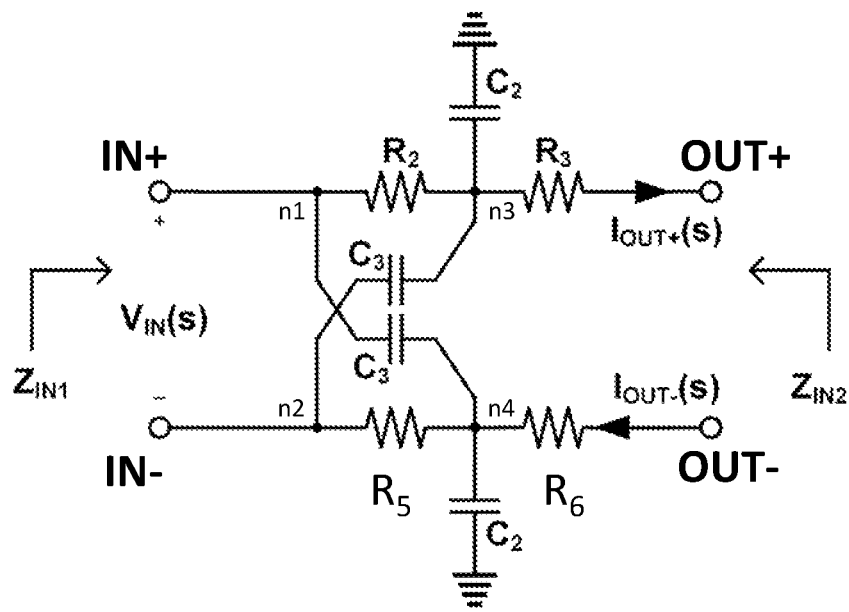
Figure 15:
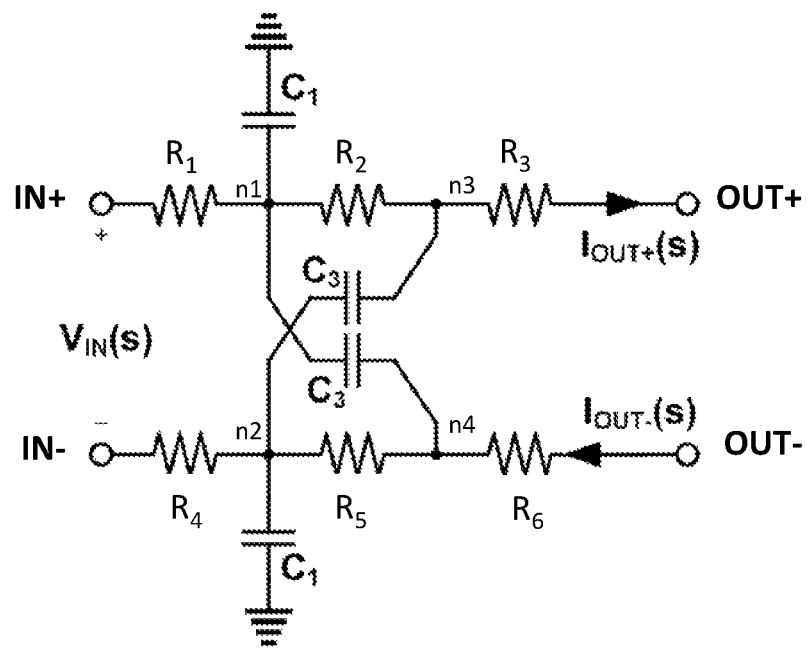
Figure 16:
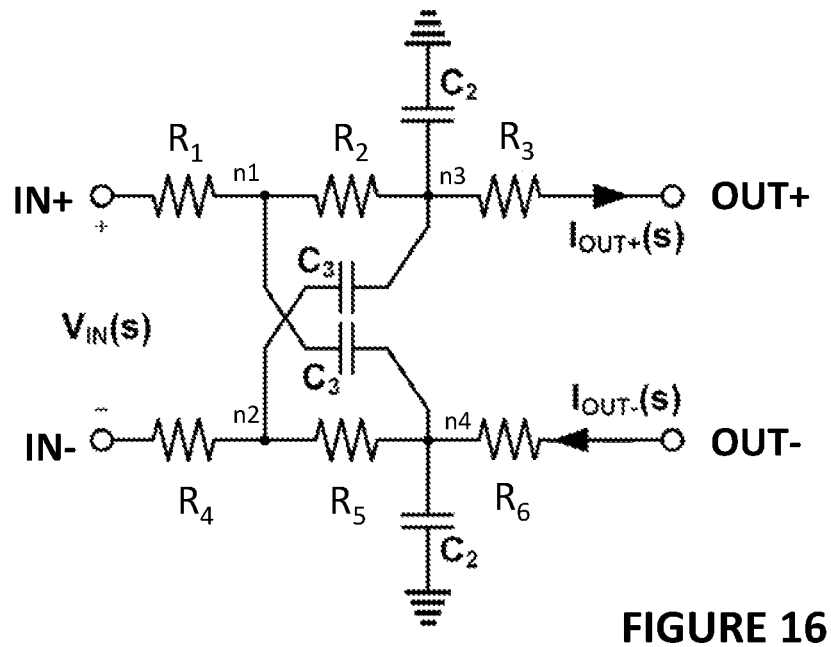

A resistive component $R_1$ can be provided in series with IN+; a resistive component $R_4$ can be provided in series with IN−. For instance, the continuous-time delay line can include a first input node IN+ and a second input node IN− for receiving the differential analog input pair. The delay line further includes a third resistive component $R_1$ between a first input node IN+ and the first resistive component $R_2$, and a fourth resistive component $R_4$ between a second input node IN− and the second resistive component $R_5$. In some embodiments, the third resistive component and the fourth resistive component are omitted, as illustrated by FIG. 14.

Figure 13:
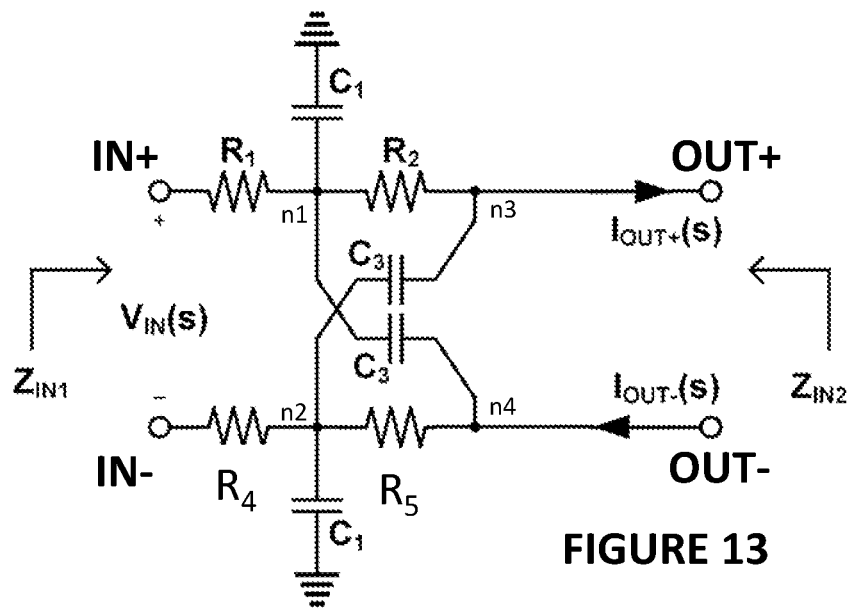

A resistive component $R_3$ can be provided in series with OUT+; a resistive component $R_5$ can be provided in series with OUT−. For instance, the continuous-time delay line can include a first output node OUT+ and a second output node OUT− for outputting the delayed differential analog input pair. The delay line further includes a fifth resistive component $R_3$ between a first output node OUT− and the first resistive component $R_2$, and a sixth resistive component $R_6$ between a second output node OUT− and the second resistive component $R_5$. In some embodiments, the third resistive component and the fourth resistive component are omitted, as illustrated by FIG. 13.

The resistance provided by $R_1$, $R_2$, and $R_3$ can be in a 1:2:1 ratio. The resistance provided by $R_4$, $R_5$, and $R_6$ can be in a 1:2:1 ratio.

For illustration, various FIGURES of the disclosure a single resistor and a single capacitor is shown for each one of these resistive components and capacitive components, however, more than one single resistor (e.g., in series) or more than one capacitor (e.g., in parallel) can be implemented to provide the desired resistances and capacitances.

Comparison Between RC and LC Lattice Structures

Table 2 compares the characteristic equations of the RC lattice with the LC lattice described in the previous section. The listed values are for a differential transconductance and input impedance. The RC lattice can be derived by noting that the substitution of R in place of sL does not change the lattice's phase response. The elimination of inductors makes this circuit more amenable to impedance scaling. Resistor and capacitor physical dimensions become more compact as impedance increases.

The RC lattice is not a constant-resistance network (see Eq. 3). In an intermediate range of frequencies, the differential impedance appears capacitive with an equivalent capacitance value of $\frac{3}{4}C_2$. A frequency-independent transconductance magnitude cannot be achieved with a second or higher order of cascading, analogous to the LC lattice structure in FIG. 6. Therefore, the RC lattice all-pass filter implementation is limited to first-order.

speed ADCs have clocking rates of around 10 GHz. the CT delay block is required to provide 1.5 clock periods of delay, or 150 ps. The input bandwidth is in the range of 500 MHz to 1000 MHz. A differential impedance value of 400Ω is assumed in the first stage. Calculated parameter values and area estimates for a second-order LC lattice and first-order RC lattice filters are listed in Table 3. A higher-order LC filter is preferred, due to decreasing delay variability with frequency, while requiring an equivalent total inductance and capacitance (and therefore area), as a first-order filter.

TABLE 3

LC and RC lattice parameters for 150 ps delay, 400 Ω differential transconductance filter

| | LC lattice | RC lattice |
|---|---|---|
| Filter Order | $2^{nd}$ | $1^{st}$ |
| Pole frequency ($\omega_P$) | 13.3 Grad/s | |
| Resistance Value | R1 = 100 Ω | R2 = 100 Ω |
| Total Resistor Area | 900 μm² | 900 μm² |
| Capacitance Value | C1 = 375 fF | C2 = 750 fF |
| Total Capacitor Area | 1250 μm² | 2400 μm² |
| Inductance Value | L = 15 nH | — |
| Total Inductor Area | 65000 μm² | 0 |
| Total Area Estimate | 67000 μm² | 3500 μm² |
| Phase Delay (DC) | 150 ps | 150 ps |
| Phase Delay (1 GHz) | 142 ps | 123 ps |
| Diff. Input Impedance (DC) | 400 Ω | 400 Ω |
| Diff. Input Impedance (1 GHz) | 400 Ω | 255 Ω |

RC Lattice with Additional Poles

Figure 12:
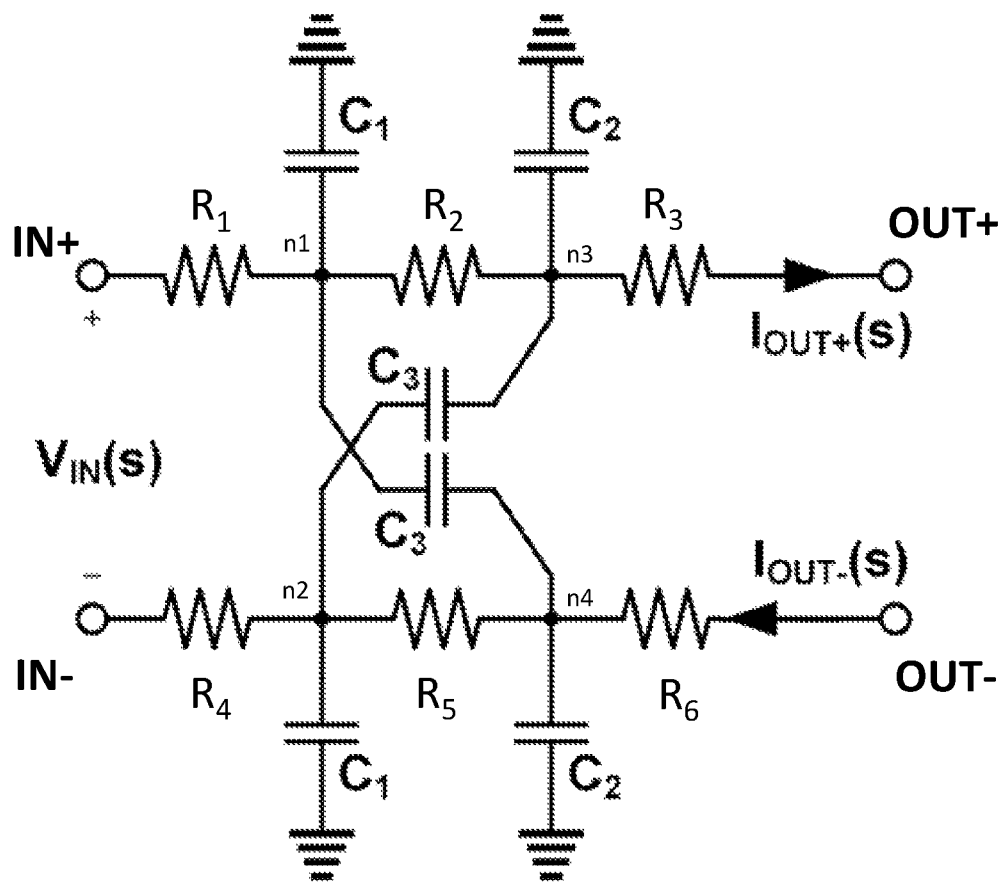
FIGS. 12-16 shows variations of the continuous time delay line having the RC lattice structure, according to some embodiments of the disclosure.

Additional capacitors can be added onto the internal nodes of the proposed first-order RC lattice (e.g., n1-n4), as illustrated in FIG. 12 (showing an RC lattice with additional decoupling capacitors to yield poles). Here $C_1$ and $C_2$ are additional capacitors that are added into the nodes between resistors ($C_1$ and $C_2$ are added to both sides of the differential circuit). The RC lattice described in FIG. 11 is can be a specific version of FIG. 12 where $C_1$ and $C_2$ are zero, $R_2=2*R_1=2*R_3$. One plate of the decoupling capacitor is coupled to the internal node of the first-order RC lattice, and the other plate of the decoupling capacitor can be coupled to ground.

In some embodiments, the continuous-time delay line can include a first decoupling capacitor $C_1$ coupled to a first node n1 between the third resistive component $R_1$ and the first resistive component $R_2$, and a second decoupling capacitor $C_1$ coupled to a second node n2 between the fourth resistive component $R_4$ and the second resistive component $R_5$. In some embodiments, the continuous-time delay line can include a third decoupling capacitor $C_2$ coupled to a third

TABLE 2

LC and RC lattice characteristic equations

| | LC lattice | RC lattice |
|---|---|---|
| $\dfrac{I_{OUT}(s)}{V_{IN}(s)}$ | $\dfrac{1 - s^2 L C_1}{2(1 + sR_1C_1)(R_1 + sL)}$ | $\dfrac{1 - sR_2C_2}{2(1 + sR_2C_2)(2R_2)}$ |
| $Z_{IN}(s)$ | $\dfrac{2R_1(1 + (L/R_1 + C_1R_1)s + s^2LC_1)}{1 + 2R_1C_1s + C_1Ls^2}$ | $\dfrac{4R_2(1 + sR_2C_2)}{1 + s3R_2C_2}$ |

While either RC or LC lattice structures can be used for the CT delay line, their parameters can be very different, e.g., for a high-speed CT ADC application. Current high-node n3 between the fifth resistive component $R_3$ and the first resistive component $R_2$, and a fourth decoupling capacitor $C_2$ coupled to a fourth node n4 between the sixth resistive component $R_6$ and the second resistive component $R_5$. In some embodiments, the continuous-time delay line can include the first, second, third, and fourth decoupling capacitors.

The purpose of adding these capacitors, $C_1$ and $C_2$, is to realize additional high-frequency poles that can create additional phase shift (group delay) and amplitude attenuation that would better match to the DAC response, i.e., the DAC seen in FIGS. 4, 6, and 7. The DACs in CT pipeline ADC and MASH ADCs are usually implemented as current-steering DACs which has a zeroth-order hold response. The zeroth-hold response exhibits a sinc(f) response in frequency domain which adds high-frequency attenuation to its output. If an ideal all-pass filter is utilized in such ADCs, the residue will increase when the input voltage, $V_{IN}(s)$, has high-frequency components where the magnitude responses of the two paths (i.e., the delay path, and the signal path generating the filtered signal) do not match at high frequencies. In some cases the sub-ADC of the signal path can have a certain characteristic response as well, which may have to be matched by the delay path. A high frequency component in the analog signal in combination with imbalance between the two paths can cause saturation in the later stages.

As shown in FIG. 12, assuming $C_1$ and $C_2$ are small, it can be approximated that they do not affect the lower frequency response that is created by $R_1$, $R_2$, $R_3$ and $C_3$. At higher frequencies, signal will leak through $C_1$ and $C_2$ paths which would behave as poles and add more attenuation.

The transfer function from $V_{IN}(s)$ to the differential current output can be written as:

$$\frac{I_{OUT+} - I_{OUT-}}{V_{IN}} = \frac{1}{R1 + R2 + R3}\left(\frac{1 - sC_3R_2}{1 + sA + s^2B}\right)$$

$$A = \frac{R_1(R_2 + R_3)}{R_1 + R_2 + R_3}(C_1 + C_3) + \frac{R_3(R_1 + R_2)}{R_1 + R_2 + R_3}(C_2 + C_3) + \frac{2R_1R_3C_3}{R_1 + R_2 + R_3}$$

$$B = \frac{R_1R_2R_3}{R_1 + R_2 + R_3}(C_1C_2 + C_1C_3 + C_2C_3)$$

Assuming $R_1 = R_3 = R/4$, $R_2 = R/2$, $C_1 = C_2 = 0$, then the above equation is identical to the ones that are described earlier in Table 2. It can be observed that the addition of $C_1$ and $C_2$ introduces an additional pole which will yield a low-pass filtering effect. The pole frequency can be adjusted easily in an Integrated Circuit (IC) implementation by adjusting the $C_1$ or $C_2$ values. As discussed earlier, this pole is desirable for high-speed CT MASH ADCs and pipeline ADCs where the DAC path exhibits a low-pass filtering response due to its zeroth-hold behavior.

Variations to the RC Lattice

A different RC all-pass filter is shown in FIG. 13. Compared against FIG. 11, the RC lattice structure of FIG. 13 no longer has resistive components $R_3$ and $R_6$ (in series with the output nodes OUT+ and OUT− respectively). A capacitive component $C_1$ is added between internal node n1 and ground. Another capacitive component $C_1$ is added between internal node n2 and ground. This structure shares many properties with the RC lattice illustrated in FIG. 11, such as an identical all-pass transconductance function. Similarly, the circuit in FIG. 13 is not a constant-resistance network and therefore cannot be cascaded to implement a higher-order filter. The structures' characteristic equations are compared in Table 3.

A flipped version of the RC all-pass filter of FIG. 13 is shown in FIG. 14. Compared against FIG. 11, the RC lattice structure of FIG. 13 no longer has resistive components $R_1$ and $R_4$ (in series with the input nodes IN+ and IN− respectively). A capacitive component $C_2$ is added between internal node n3 and ground. A capacitive component $C_2$ is added between internal node n4 and ground.

The two RC topologies have different input impedances even with identical transconductance transfer functions. The FIG. 13 structure is not symmetric and presents a larger capacitive load at one of the two ports. This additional loading is undesirable, since it requires a larger drive capability of the driving circuits. Additionally, the circuit's total area is increased due to the addition of the shunt capacitance.

In general, it should be noted that multiple solutions exist for R' and C' that produce an equivalent phase response. For example, R'=2R and C'=C/4 can result in the same 90° phase shift frequency, but a higher transconductance, an input impedance less variable with frequency for the left-side port, and a greater equivalent capacitive load for the right-side port, as shown in FIG. 13.

TABLE 4

RC lattice characteristic equations

|  | RC Lattice (FIG. 9) | RC Lattice (FIG. 13) |
| --- | --- | --- |
| $\dfrac{I_{OUT}(s)}{V_{IN}(s)}$ | $\dfrac{1 - sR_2C_2}{4R_2(1 + sR_2C_2)}$ | $\dfrac{1 - sR_2C_3}{4R_2(1 + sR_2C_3)}$ |
| $Z_{IN}(s)$ | $Zin1 = Zin2 = \dfrac{4R_2(1 + sR_2C_2)}{1 + s3R_2C_2}$ | $Zin1 = \dfrac{4R_2(1 + sR_2C_3)}{1 + s6R_2C_3 + s^2C_3^2R_2^2}$ |
|  |  | $Zin2 = \dfrac{4R_2(1 + sR_2C_3)}{1 + s2R_2C_3}$ |

All-Pass Element Alternatives

Traditionally, time delays are implemented either as transmission lines, LC delay lines or all-pass gm-RC delay circuits. For the current generation of ADCs clocked around 10 GHz, transmission lines can be too long and lossy to be put on-chip. LC delay lines have been discussed above. Active gm-RC circuits present design trade-offs in achievable frequency, noise, linearity and power consumption.

CTP Stage Architecture Alternatives

In a pipeline ADC with a single front-end continuous-time stage, the timing alignment prior to current subtraction is implemented using an analog prediction filter before the quantizer. This is a more power-intensive and complex solution compared to a passive filter. Potentially, a predictive filter can be implemented in digital form.

Advantages of Using an RC Lattice Delay Line in a Residue Producing Circuit

As explained herein, a residue producing circuit can include a continuous time delay line to receive an analog input. The continuous time delay line can have a resistor-capacitor (RC) lattice circuit. The topology for implementing the delay line can vary depending on the embodiment. The residue producing circuit further includes an analog-to-digital converter for converting the analog input to a digital signal, a digital-to-analog converter for generating a reconstructed analog signal based on the digital signal, and a node for combining the analog input and the reconstructed analog signal to generate a residue signal. For optimal performance, the continuous time delay line matches a phase component of the analog-to-digital converter and the digital-to-analog converter.

To further improve performance and matching, the continuous time delay line of the residue producing circuit can further include decoupling capacitors to add high frequency poles to a transfer function of the continuous time delay line. The continuous time delay line can act as a low pass filter or have a low pass filtering effect to match a frequency response of the digital-to-analog converter.

In some embodiments, the residue producing circuit is part of a continuous time pipeline analog-to-digital converter. In some embodiments, the residue producing circuit is part of a CT MASH ADC, the analog input is an analog output of a first delta-sigma modulator stage. The analog-to-digital converter is part of the first delta-sigma modulator stage. The residue signal is provided as input to a second delta-sigma modulator stage.

The disclosed RC lattice structures have the advantages of smaller area and easier to scale for higher impedance levels. In some embodiments, the RC lattice can be used as the critical CT delay element between the front-end stage and the back-end stage. With the disclosed RC lattice with additional poles, the response can be optimized for a particular ADC or signal path generating the filtered signal. For instance, the optimization can be used to improve its out-of-band blocker tolerance. In some embodiments, the RC lattice can be used for any power-scaled version 0-X MASH ADC (e.g., inside 28 nm transceivers) or CT pipeline ADC where compact integrated CT delay elements are desired. Generally speaking, the use of delay lines in CT ADCs may grow in popularity in the upcoming years because that is the essential block in wide-band CT MASH ADCs. The passive network delay line (e.g., RC lattice delay lines) is more important in high-performance ADCs because the passive network is essentially linear and lower noise.

Method for Producing a Residue

Figure 17:
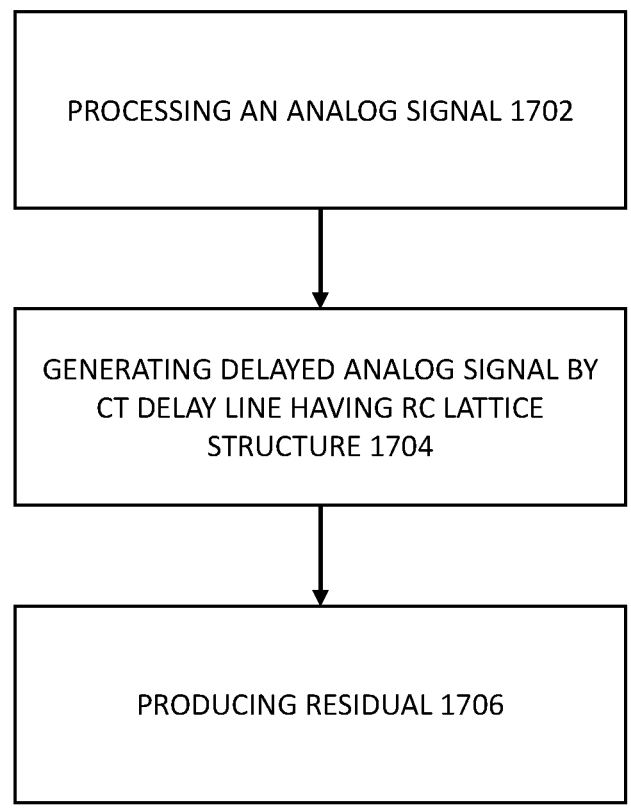
FIG. 17 is a flow diagram illustrating an exemplary method for generating a residue signal.

FIG. 17 is a flow diagram illustrating an exemplary method for generating a residue signal. In task 1702, a signal path processes an analog signal to generate a filtered analog signal. In task 1704, a continuous time delay line having a resistor-capacitor (RC) lattice structure generating a delayed analog signal. The continuous time delay line matches a phase component of the signal path. In task 1706, a residual signal is produced based on the delayed analog signal and the filtered analog signal.

In some embodiments, the continuous time delay line further includes decoupling capacitors coupled to the RC lattice structure to delay the analog signal according to a low-pass filtering response.

In some embodiments, processing the analog signal by the signal path comprises: converting the analog signal into a digital signal, and converting, by a digital-to-analog converter, the digital signal into the filtered analog signal.

In some embodiments, the continuous time delay line has a frequency response which corresponds to a frequency response of the digital-to-analog converter.

In some embodiments, the frequency response of the digital-to-analog converter comprises a zero-order hold response.

Variations and Implementations

Note that the circuits discussed above with reference to the figures are applicable to any integrated circuits that involve high speed analog-to-digital converters where a continuous-time delay line is desired. In certain contexts, the features discussed herein can be applicable to medical systems, scientific instrumentation, wireless and wired communications, radar, industrial process control, audio and video equipment, instrumentation, and other digital-processing-based systems.

In the discussions of the embodiments above, some circuit elements can readily be replaced, substituted, or otherwise modified in order to accommodate particular circuitry needs. In one example embodiment, a CT ADC having the RC lattice delay may be implemented as chip that is on a board of an associated electronic device. The board can be a general circuit board that can hold various components of the internal electronic system of the electronic device and, further, provide connectors for other peripherals. The board can provide the electrical connections by which the other components of the system can communicate electrically. For instance, the CT ADC can be coupled to an input and digitizes the input to produce digital data that is processed by a processor on the board. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, antennas, transmitters, receivers, and peripheral devices may be attached to the board as plug-in cards, via cables, or integrated into the board itself.

It is also imperative to note that all of the specifications, dimensions, and relationships outlined herein (e.g., the number of processors, logic operations, etc.) have only been offered for purposes of example and teaching only. Such information may be varied considerably without departing from the spirit of the disclosure, or the scope of the appended claims (if any) or examples. The specifications apply only to one non-limiting example and, accordingly, they should be construed as such. In the foregoing description, example embodiments have been described with reference to particular component arrangements. Various modifications and changes may be made to such embodiments without departing from the scope of the appended claims (if any) or examples. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the disclosure, but may or may not necessarily be combined in the same embodiments. Numerous other changes, substitutions, variations, alterations, and modifications may be ascertained to one skilled in the art and it is intended that the disclosure encompass all such changes, substitutions, variations, alterations, and modifications as falling within the scope of the appended claims (if any) and examples described herein. Note that all optional features of the apparatus described above may also be implemented with respect to the method or process described herein and specifics in the examples may be used anywhere in one or more embodiments.

EXAMPLES

In some embodiments, a continuous time (CT) delay line, for delaying a differential analog input pair in a circuit producing a residual signal, comprises a RC lattice structure for generating a delayed differential analog input signal pair. The RC lattice structure comprises two resistive components and two capacitive components, wherein either (1) the two resistive components are cross coupled or (2) the two capacitive components are cross coupled. The residual signal is produced from the delayed differential analog input signal pair and a filtered version of the differential analog input pair (e.g., a reconstructed version of the differential analog input pair).

In some embodiments, the CT delay line is connected between an input having the differential analog input pair and a summation node having the filtered version of the differential analog input pair. The differential analog input pair is digitized by a flash analog-to-digital converter (ADC) to generate a digital signal. The digital signal generated by the flash ADC is provided to a digital-to-analog converter DAC to produce the filtered version of the differential analog input pair.

In some embodiments, the CT delay line is connected between an input having the differential analog input pair and a summation node having the filtered version of the differential analog input pair. The differential analog input pair is digitized by an analog-to-digital converter of a previous stage or a delta-sigma modulator to generate a digital signal. The digital signal is provided to a digital-to-analog converter DAC to produce the filtered version of the differential analog input pair.

What is claimed is:

1. A continuous time delay line for a residual producing circuit, the continuous time delay line comprising:
   a resistor-capacitor (RC) lattice for delaying a differential analog input pair, the RC lattice having first and second resistive components and first and second capacitive components, the first and second resistive components being cross coupled with respect to the first and second capacitive components;
   wherein the delayed differential analog input pair and a filtered version of the differential analog input pair are used to generate a residual signal, and parameters of the RC lattice correspond to a phase component of a circuit path producing the filtered version of the differential analog input pair.

2. The continuous time delay line of claim 1, further comprising:
   a first input node and a second input node for receiving the differential analog input pair;
   a third resistive component between a first input node and the first resistive component; and
   a fourth resistive component between a second input node and the second resistive component.

3. The continuous time delay line of claim 1, further comprising:
   a first output node and a second output node for outputting the delayed differential analog input pair;
   a fifth resistive component between a first output node and the first resistive component; and
   a sixth resistive component between a second output node and the second resistive component.

4. The continuous time delay line of claim 1, wherein the RC lattice is a part of a first-order all-pass filter circuit.

5. The continuous time delay line of claim 2, further comprising:
   a first decoupling capacitor coupled to a first node between the third resistive component and the first resistive component; and
   a second decoupling capacitor coupled to a second node between the fourth resistive component and the second resistive component.

6. The continuous time delay line of claim 3, further comprising:
   a third decoupling capacitor coupled to a third node between the fifth resistive component and the first resistive component; and
   a fourth decoupling capacitor coupled to a fourth node between the sixth resistive component and the second resistive component.

7. The continuous time delay line of claim 1, wherein the delayed differential analog input pair and the filtered version of the differential analog input pair are coupled to a summation node to generate the residual signal.

8. The continuous time delay line of claim 1, wherein the filtered version of the differential analog input pair is a signal reconstructed from a digitized version of the differential analog input pair.

9. The continuous time delay line of claim 1, wherein the differential analog input pair is digitized by an analog-to-digital converter, whose output is provided to a digital-to-analog converter to produce the filtered version of the differential analog input pair.

10. The continuous time delay line of claim 1, wherein:
    the differential analog input pair is an analog output of a first delta-sigma modulator stage;
    the differential analog input pair is digitized by an analog-to-digital converter of the first delta-sigma modulator stage, whose output is provided to a digital-to-analog converter to produce the filtered version of the differential analog input pair; and
    the residue signal is provided as input to a second delta-sigma modulator stage.

11. A residue producing circuit comprising:
a continuous time delay line to receive an analog input, said continuous time delay line having a resistor-capacitor lattice circuit;
an analog-to-digital converter for converting the analog input to a digital signal;
a digital-to-analog converter for generating a reconstructed analog signal based on the digital signal; and
a node for combining the analog input and the reconstructed analog signal to generate a residue signal;
wherein the continuous time delay line matches a phase component of the analog-to-digital converter and the digital-to-analog converter.

12. The residue producing circuit of claim 11, wherein the continuous time delay line further comprises decoupling capacitors to add high frequency poles to a transfer function of the continuous time delay line.

13. The residue producing circuit of claim 11, wherein the continuous time delay line acts as a low pass filter to match a frequency response of the digital-to-analog converter.

14. The residue producing circuit of claim 11, wherein the residue producing circuit is part of a continuous time pipeline analog-to-digital converter.

15. The residue producing circuit of claim 11, wherein:
the analog input is an analog output of a first delta-sigma modulator stage;
the analog-to-digital converter is part of the first delta-sigma modulator stage; and
the residue signal is provided as input to a second delta-sigma modulator stage.

16. A method for generating a residue signal, the method comprising:
processing an analog signal by a signal path to generate a filtered analog signal, wherein the processing comprises converting an analog signal into a digital signal, and converting, by a digital-to-analog converter, the digital signal into a filtered analog signal;
generating a delayed analog signal based on the analog signal by a continuous time delay line having a resistor-capacitor (RC) lattice structure, wherein the continuous time delay line matches a phase component of the signal path; and
producing a residual signal based on the delayed analog signal and the filtered analog signal.

17. The method of claim 16, wherein the continuous time delay line further includes decoupling capacitors coupled to the RC lattice structure to delay the analog signal according to a low-pass filtering response.

18. The method of claim 16, wherein the RC lattice structure is a part of a first-order all-pass filter circuit.

19. The method of claim 16, wherein the continuous time delay line has a first frequency response which corresponds to a second frequency response of the digital-to-analog converter.

20. The method of claim 19, wherein the second frequency response of the digital-to-analog converter comprises a zero-order hold response.

* * * * *